United States Patent
Cheng et al.

(10) Patent No.: US 9,997,606 B2
(45) Date of Patent: Jun. 12, 2018

(54) FULLY DEPLETED SOI DEVICE FOR REDUCING PARASITIC BACK GATE CAPACITANCE

(71) Applicant: INTERNATIONAL BUSINESS MACHINES CORPORATION, Armonk, NY (US)

(72) Inventors: Kangguo Cheng, Schenectady, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/282,349

(22) Filed: Sep. 30, 2016

(65) Prior Publication Data

US 2018/0097076 A1 Apr. 5, 2018

(51) Int. Cl.
| | |
|---|---|
| H01L 29/417 | (2006.01) |
| H01L 23/535 | (2006.01) |
| H01L 29/06 | (2006.01) |
| H01L 21/265 | (2006.01) |
| H01L 21/768 | (2006.01) |
| H01L 21/762 | (2006.01) |
| H01L 29/66 | (2006.01) |
| H01L 21/306 | (2006.01) |

(52) U.S. Cl.
CPC ...... H01L 29/41783 (2013.01); H01L 21/265 (2013.01); H01L 21/30604 (2013.01); H01L 21/76243 (2013.01); H01L 21/76895 (2013.01); H01L 23/535 (2013.01); H01L 29/0649 (2013.01); H01L 29/66545 (2013.01)

(58) Field of Classification Search
CPC ......... H01L 29/41783; H01L 21/30604; H01L 29/66545; H01L 21/76243; H01L 21/265; H01L 29/0649; H01L 23/535; H01L 21/76895
See application file for complete search history.

(56) References Cited

U.S. PATENT DOCUMENTS

| | | | |
|---|---|---|---|
| 6,541,345 B1 | 4/2003 | Komatsu | |
| 7,659,579 B2 | 2/2010 | Anderson et al. | |
| 7,671,413 B2 | 3/2010 | Furukawa | |
| 7,821,066 B2 | 10/2010 | Lebby et al. | |

(Continued)

*Primary Examiner* — Kyoung Lee
(74) *Attorney, Agent, or Firm* — Tutunjian & Bitetto, P.C.; Vazken Alexanian

(57) ABSTRACT

A method is presented for forming a semiconductor structure. The method includes forming a bilayer buried insulator over a substrate, forming an extremely thin silicon-on-insulator (ETSOI) over the bilayer buried insulator, forming a dummy gate, and forming a source/drain next to the dummy gate, the source/drain defining a raised source/drain region. The method further includes depositing a dielectric material over the raised source/drain regions, removing the dummy gate to define a recess, implanting a species within a first layer of the bilayer buried insulator, and depositing a gate dielectric and a conducting material within the recess. The method further includes removing the substrate, etching the implanted portion of the first layer of the bilayer buried insulator to expose a surface of a second layer of the bilayer buried insulator, and forming a back gate over the exposed second layer, the back gate self-aligned to the ETSOI channel.

20 Claims, 12 Drawing Sheets

(56) References Cited

U.S. PATENT DOCUMENTS

| | | |
|---|---|---|
| 8,030,145 B2 | 10/2011 | Chang et al. |
| 8,319,216 B2 | 11/2012 | Akimoto et al. |
| 8,507,989 B2 | 8/2013 | Khakifirooz et al. |
| 8,575,699 B2 | 11/2013 | Chan et al. |
| 8,946,702 B2 | 2/2015 | Yamazaki et al. |
| 2009/0057746 A1 | 3/2009 | Sugll et al. |
| 2013/0146959 A1* | 6/2013 | Cheng ............... H01L 29/66181 257/310 |
| 2013/0214356 A1* | 8/2013 | Cheng ................... H01L 21/84 257/347 |

* cited by examiner

FULLY DEPLETED SOI DEVICE FOR REDUCING PARASITIC BACK GATE CAPACITANCE

BACKGROUND

Technical Field

The present invention relates generally to semiconductor devices, and more specifically, to a fully-depleted silicon-on-insulator (FDSOI) device for reducing parasitic back gate capacitance.

Description of the Related Art

As the size of metal oxide semiconductor field effect transistors (MOSFETs) and other devices decreases, the dimensions of source/drain regions, channel regions, and gate electrodes of the devices, also decreases. The design of ever-smaller planar transistors with short channel lengths makes it necessary to provide very shallow source/drain junctions. Shallow junctions are needed to avoid lateral diffusion of implanted dopants into the channel, since such diffusion disadvantageously contributes to leakage currents and poor breakdown performance. Shallow source/drain junctions, with a thickness of about 30 nm to 100 nm, are generally required for acceptable performance in short channel devices. Silicon-on-insulator (SOI) technology allows the formation of high-speed, shallow junction devices. In addition, SOI devices improve performance by reducing parasitic junction capacitance.

SUMMARY

In accordance with an embodiment, a method is provided for forming a semiconductor structure with reduced parasitic back gate capacitance. The method includes forming a bilayer buried insulator over a semiconductor substrate, forming an extremely thin silicon-on-insulator (ETSOI) over the bilayer buried insulator, forming a dummy gate over an ETSOI channel, and forming a source/drain next to dummy gate, the source/drain defining a raised source/drain region, The method further includes depositing a dielectric material over the raised source/drain, removing the dummy gate to define a recess, implanting a species within a first layer of the bilayer buried insulator, and depositing a gate dielectric and a conducting material within the recess defined by the removal of the dummy gate. The method further includes removing the semiconductor substrate, etching the implanted portion of the first layer of the bilayer buried insulator to expose a surface of a second layer of the bilayer buried insulator, and forming a back gate over the exposed second layer, the back gate self-aligned to the ETSOI channel.

In accordance with another embodiment, a semiconductor device configured for reducing parasitic back gate capacitance is provided. The semiconductor device includes a bilayer buried insulator formed over a semiconductor substrate, an extremely thin silicon-on-insulator (ETSOI) formed over the bilayer buried insulator, a source/drain formed next to a dummy gate, the source/drain defining a raised source/drain region, a dielectric material deposited over the raised source/drain, a gate dielectric and a conducting material deposited within the recess defined by the removal of the dummy gate, and a back gate is formed over the exposed second layer, the back gate self-aligned to the ETSOI channel.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
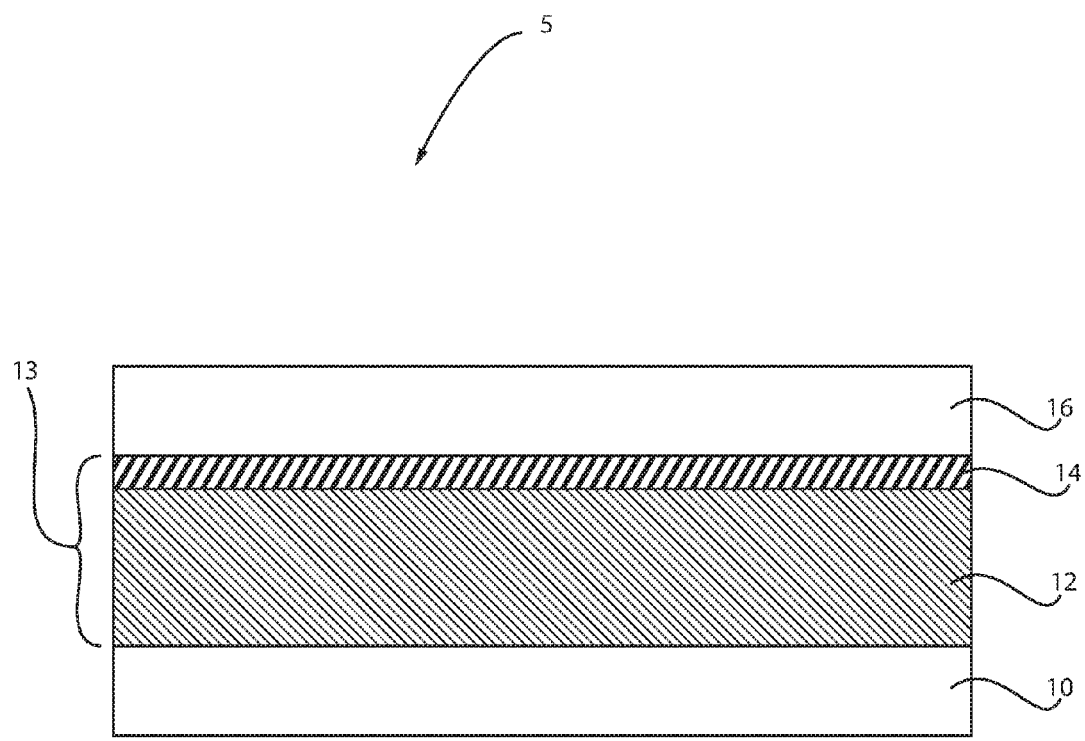
FIG. 1 is a cross-sectional view of a semiconductor structure including an extremely thin silicon-on-insulator (ETSOI) layer over a bilayer buried insulator, the bilayer buried insulator including a silicon nitride (SiN) layer and a silicon oxide ($SiO_2$) layer, in accordance with an embodiment of the present invention.

Embodiments of the present invention relate generally to the formation of a semiconductor structure for reducing parasitic back gate capacitance. The formation includes forming a bilayer buried insulator over a semiconductor substrate, forming an extremely thin silicon-on-insulator (ETSOI) over the bilayer buried insulator, forming a dummy gate over an ETSOI channel, and forming a source/drain next to the dummy gate, the source/drain defining a raised source/drain region. The method further includes depositing a dielectric material over the raised source/drain, removing the dummy gate to define a recess, implanting a species within a first layer of the bilayer buried insulator, and depositing a gate dielectric and a conducting material within the recess defined by the removal of the dummy gate. The method further includes removing the semiconductor substrate, removing the implanted species, etching a portion of the first layer of the bilayer buried insulator to expose a surface of a second layer of the bilayer buried insulator, and forming a back gate over the exposed second layer, the back gate self-aligned to the ETSOI channel.

Moreover, embodiments of the present invention relate generally to a semiconductor device for reducing parasitic back gate capacitance. The semiconductor device includes a bilayer buried insulator formed over a semiconductor substrate, an extremely thin silicon-on-insulator (ETSOI) formed over the bilayer buried insulator, a source/drain formed next to a dummy gate, the source/drain defining a raised source/drain region, and a dielectric material deposited over the raised source/drain. The semiconductor structure further includes a species implanted within a first layer of the bilayer buried insulator after removal of the dummy gate defining a recess and a gate dielectric and a conducting material deposited within the recess defined by the removal of the dummy gate. The semiconductor substrate is removed, the implanted species is removed, and a portion of the first layer of the bilayer buried insulator is etched to expose a surface of a second layer of the bilayer buried insulator. Subsequently, a back gate is formed over the exposed second layer, the back gate self-aligned to the ETSOI channel.

In one or more embodiments, an ETSOI MOSFET device is illustrated having a thin buried oxide (thin BOX) and a back gate, wherein the semiconductor device shows a substantially reduced capacitance between the back gate and the source/drain regions.

In one or more embodiments, the MOSFET device is provided with a thin BOX under the ETSOI channel and a thicker dielectric under the source and drain that reduces the source/drain to back gate parasitic capacitance. The thicker dielectric portion is self-aligned with the gate.

In one or more embodiments, the invention provides a semiconductor device on an extremely thin SOI layer (ET-SOI) on top of the thin BOX layer (SiO₂) that improves gate sensitivity and a thin BOX layer (SiO₂+SiN), which reduces the back gate to S/D parasitic capacitance.

In one or more embodiments, the invention provides a method and structure for forming a back gate with reduced parasitic capacitance between the source/drain to the back gate by using a bilayer buried oxide. A back gate is formed self-aligned to the FDSOI (fully depleted SOI) channel with a first thin BOX layer to increase the coupling between the back gate to the channel. Meanwhile, in the source/drain region, the thick BOX layer can be used to reduce the parasitic capacitance.

In one or more embodiments, the invention provides an FDSOI device with a bilayer buried insulator in which the first layer of insulator is self-aligned under the channel to improve the back gate capability while both the first and the second insulator are in the source/drain region to minimize the parasitic capacitance. A back gate contact is located through the SOI and the bilayer insulator to reach the back gate. Therefore, a self-aligned back gate is formed with a bilayer buried dielectric underneath SOI channel by using implantation to damage and remove the second layer of the buried dielectric only underneath the channel.

In one or more embodiments, the back gate is formed after forming the FDSOI transistor. The present invention does not require any alignment marker. The back gate is formed in a true self-aligned manner. Further, the present invention has thin buried dielectric in the channel region and thicker buried dielectric in the source/drain region to reduce the parasitic capacitance.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

As used herein, the term "raised" in combination with source and/or drain denotes that the source and/or drain region is formed over a semiconductor material layer that is present on an upper surface of the substrate on which the gate dielectric is present.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

It is to be understood that the present invention will be described in terms of a given illustrative architecture; however, other architectures, structures, substrate materials and process features and steps/blocks can be varied within the scope of the present invention. It should be noted that certain features may not be shown in all figures for the sake of clarity. This is not intended to be interpreted as a limitation of any particular embodiment, or illustration, or scope of the claims.

FIG. 1 is a cross-sectional view of a semiconductor structure including an extremely thin silicon-on-insulator (ETSOI) layer over a bilayer buried insulator, the bilayer buried insulator including a silicon nitride (SiN) layer and a silicon oxide (SiO$_2$) layer, in accordance with an embodiment of the present invention.

A semiconductor structure 5 includes a semiconductor substrate 10. A bilayer buried insulator 13 is formed directly on the semiconductor substrate 10. The bilayer buried insulator 13 includes a first layer 12 and a second layer 14. The first layer 12 can be, e.g., a silicon nitride (SiN) layer. The second layer 14 can be, e.g., a silicon oxide (SiO$_2$) layer. An extremely thin semiconductor-on-insulator (ETSOI) layer 16 is formed over the bilayer buried insulator 13. The ETSOI layer 16 is formed directly over the second layer 14 of the bilayer buried insulator 13. The first layer (SiN) can be, e.g., about 100 nm and the second layer can be, e.g., about 10 nm (SiO$_2$). The semiconductor structure 5 can be made by, e.g., wafer bonding.

In one or more embodiments, a substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, Al$_2$O$_3$, SiO$_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The ETSOI layer 16 can comprise any semiconducting material including, but not limited to Si, strained Si, SiC, SiGe, SiGeC, Si alloys, Ge, Ge alloys, GaAs, InAs, and InP, or any combination thereof. The ETSOI layer 16 can be thinned to a desired thickness by planarization, grinding, wet etch, dry etch, oxidation followed by oxide etch, or any combination thereof. One method of thinning the ETSOI layer 16 is to oxidize the Si by a thermal dry or wet oxidation process, and then wet etch the oxide layer using a hydrofluoric acid mixture. This process can be repeated to achieve the desired thickness. In one embodiment, the ETSOI layer 16 can have a thickness ranging from 1.0 nm to 25.0 nm. In another embodiment, the ETSOI layer 16 can have a thickness ranging from 5.0 nm to 15.0 nm. In a further embodiment, the ETSOI layer 16 can have a thickness ranging from 6.0 nm to 10.0 nm.

An "ETSOI substrate" is a semiconductor on insulator (SOI) substrate, in which the semiconductor on insulator (SOI) layer has a thickness of 25 nm or less. As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 2:
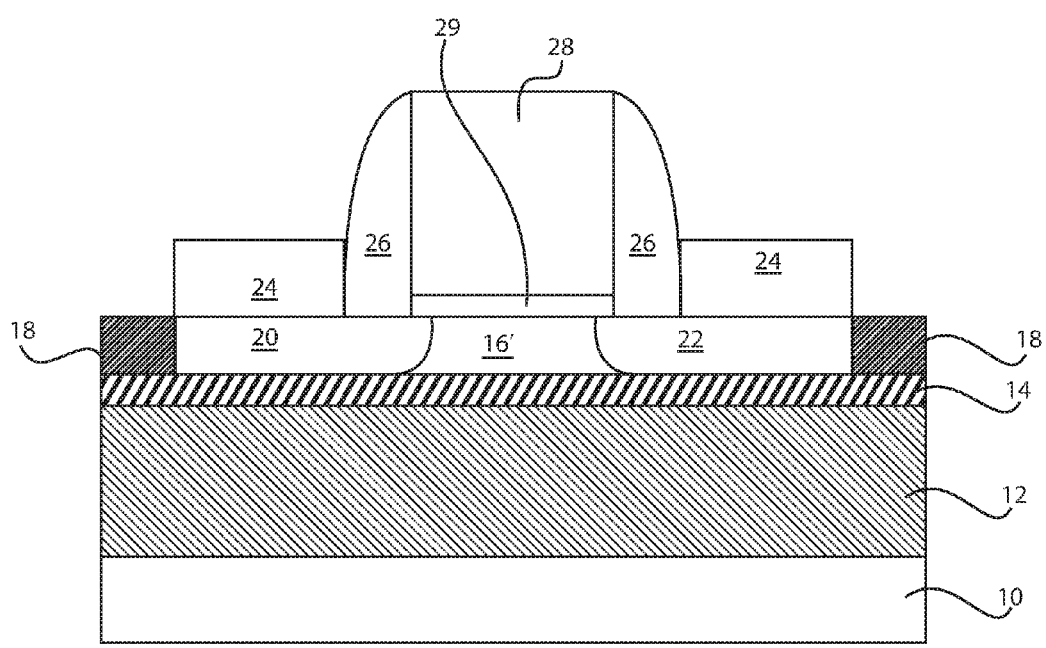
FIG. 2 is a cross-sectional view of the semiconductor structure of FIG. 1 where a dummy gate with sidewall spacers is formed over an ETSOI channel and a source/drain with raised source/drain regions is formed next to the dummy gate, in accordance with an embodiment of the present invention.

FIG. 2 is a cross-sectional view of the semiconductor structure of FIG. 1 where a dummy gate with sidewall spacers is formed over an ETSOI channel and a source/drain with raised source/drain regions is formed next to the dummy gate, in accordance with an embodiment of the present invention.

In various embodiments, the ETSOI device fabrication can be followed by forming isolation 18 (e.g., shallow trench isolation (STI)), a dummy gate 28, sidewall spacers 26 formed on opposed ends of the dummy gate 28, source 20, drain 22, and raised source/drain regions 24. An ETSOI channel 16' can be formed between the source 20 and the drain 22. Additionally, the dummy gate 28 can rest on a dummy gate oxide 29. The dummy gate oxide 29 is positioned over the ETSOI channel 16' and between bottom portions of the spacers 26. The dummy gate 28 has a thickness greater than the thickness of the dummy gate oxide 29. The ETSOI channel 16' has a thickness approximately equal to the thickness of the source 20 and drain 22. The raised source drain regions 24 have a thickness greater than the thickness of the source 20 and the drain 22.

The shallow trench isolation (STI) regions 18 are formed by etching a trench in the substrate utilizing a conventional dry etching process such as RIE or plasma etching. The trenches can optionally be lined with a conventional liner material, e.g., silicon nitride or silicon oxynitride, and then CVD or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

In various embodiments, the dummy gate 28 is formed by forming the dummy gate 28 followed by patterning. The dummy gate 28 can comprise a stack of materials, such as a dummy gate dielectric (e.g., silicon oxide), amorphous silicon, a dielectric cap (e.g., silicon nitride). Later in the process sequence, the dummy gate 28 is removed, and replaced with a function gate structure having at least one gate dielectric and the at least one gate conductor. The dummy gate 28 has a thickness that is greater than the thickness of the raised source/drain 24. The dummy gate 28 can also have a thickness that is greater than the thickness of the source and drain regions 20, 22. The top surface of the dummy gate 28 can be coplanar with the top surface of the spacers 26.

The spacers 26 can be formed by deposition followed by a directional etch (e.g., RIE). Spacers 26 can be formed along the sidewalls of the dummy gate 28. For example, spacer material such as a nitride (e.g., silicon nitride) can be deposited in a conventional manner, such as by chemical vapor deposition (CVD) or atomic layer deposition (ALD). Other techniques, which can be suitable for deposition of a nitride layer, include low-pressure CVD (LPCVD) and atmospheric pressure (CVD) (APCVD). Portions of the deposited nitride layer are subsequently etched away in a conventional manner to form the spacers 26. Spacer material can be silicon oxide, silicon oxynitride, silicon nitride, SiBCN, SiOCN, SiOC, or any suitable combination of those materials.

The dummy gate 28 and the spacers 26 are formed before the source/drain 20, 22. In various embodiments, an in-situ doped source/drain 20, 22 is deposited or formed via epitaxial growth. Depending on how the epitaxial growth develops, it may be necessary to anisotropically etch the epitaxial growth.

The doped region 20, 22 can be formed over the second layer 14 of the bilayer buried insulator 13. The dopant can be provided to the doped region(s) 20, 22 (i.e., source/drain region(s)) by ion implantation, and source/drains formed by annealing the doped region(s) 20, 22. In various embodiments, the doped regions 20, 22 can be n-doped or p-doped.

In various embodiments, the doped regions 20, 22 can be doped in-situ or ex-situ, for example, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain regions 20, 22 can include forming an in situ doped epitaxial semiconductor material over the ETSOI layer 16 (FIG. 1). The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 20, 22 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions 20, 22.

Examples of silicon including source gases can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gases for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition can result in crystal defects and film cracking.

The epitaxial semiconductor material that provides the source and drain regions 20, 22 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gases.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$).

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

It is noted that the source region 20 and the drain region 22 can include raised portions 24 that are formed on top of the source/drain regions 20, 22. The raised portions 24 can be composed of epitaxially grown semiconductor material. The raised portions 24 of the source region 20 and the drain region 22 can be doped by an in-situ dopant process during epitaxial growth and/or can be doped by ion implantation.

The term "raised" as used to describe the raised source and drain regions 24 means that the lower surface of the raised source and drain regions 24 is in direct physical contact with the surface of the ETSOI substrate 16 (FIG. 1). The raised source and drain regions 24 can be formed using a selective epitaxial growth process. The fact that the process is selective means that the deposited semiconductor material grows only on exposed semiconductor regions and does not grow on a dielectric, such as silicon oxide. The epitaxial growth process can be continued until the raised source and drain regions 24 have a height ranging from 5 nm to 50 nm, as measured from the upper surface of the ETSOI substrate 16. Typically, the raised source and drain regions 24 are composed of a silicon containing material, such as silicon, silicon germanium, or silicon doped with carbon (Si:C).

However, a number of different sources can be used for the deposition of the semiconductor material that forms the raised source/drain regions 24. In some embodiments, in which the semiconductor material that forms the raised source/drain regions 24 is composed of silicon, the silicon gas source for epitaxial deposition can be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the semiconductor material that forms the raised source/drain regions 24 is composed of germanium, the germanium gas source for epitaxial deposition can be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that forms the raised source/drain region 24 is composed of silicon germanium, the silicon sources for epitaxial deposition can be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources can be selected from the group consisting of germane, digermane, halogermane, dichlorogermane, trichlorogermane, tetrachlorogermane and combinations thereof.

Figure 3:
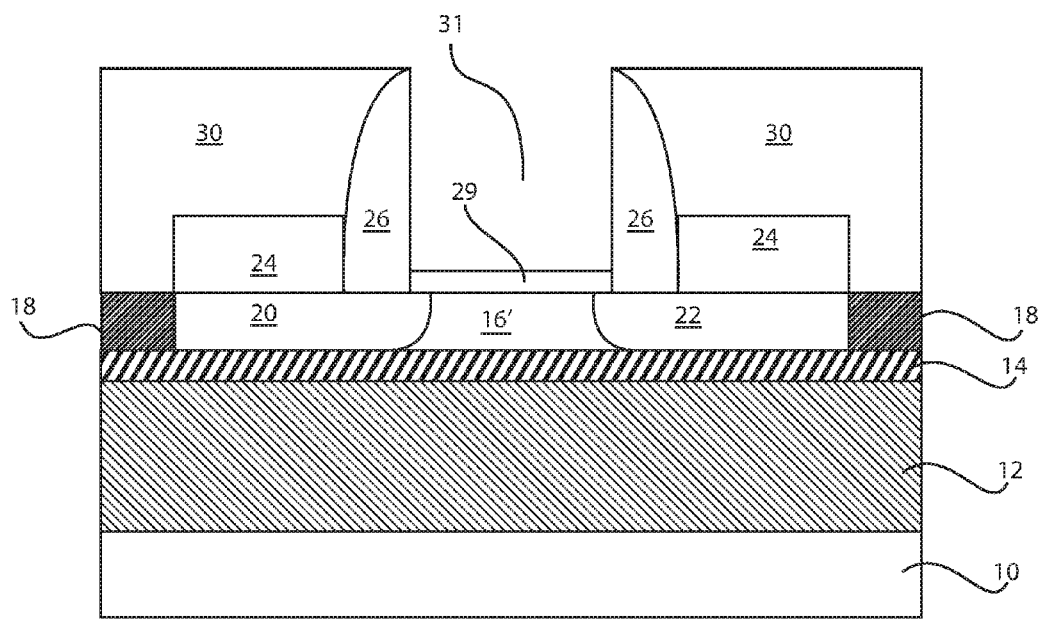
FIG. 3 is a cross-sectional view of the semiconductor device of FIG. 2 where an oxide layer is deposited over the raised source/drain and the dummy gate is removed to define a recess, in accordance with an embodiment of the present invention.

FIG. 3 is a cross-sectional view of the semiconductor device of FIG. 2 where an interlevel dielectric (ILD) layer is deposited over the raised source/drain and the dummy gate is removed to define a recess, in accordance with an embodiment of the present invention. The ILD may have a dielectric liner (e.g., silicon nitride) and a filling dielectric material (e.g., silicon oxide).

In various embodiments, an inter-layer dielectric (ILD) oxide fill takes place. The ILD 30 is planarized. The ILD 30 encompasses or envelopes or surrounds the entire raised source/drain regions 24. The ILD 30 engages an outer surface of the sidewall spacers 26. In one example embodiment, the ILD 30 extends to a top point of the spacers 26. Stated differently, the ILD 30 is flush with the distal end of the spacers 26. Additionally, the dummy gate 28 (FIG. 2) is removed and a gap or recess 31 is presented between the sidewall spacers 26.

In one or more embodiments, the ILD 30 can have a thickness in the range of about 20 nm to about 150 nm, or in the range of about 30 nm to about 50 nm.

The ILD 30 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 30 include any of the aforementioned materials in porous form, or in a form that changes during processing to or from being porous and/or permeable to being non-porous and/or non-permeable.

In various embodiments, the height of the ILD 30 can be selectively reduced by chemical-mechanical polishing (CMP) and/or etching. Therefore, the planarization process can be provided by CMP. Other planarization process can include grinding and polishing.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 4:
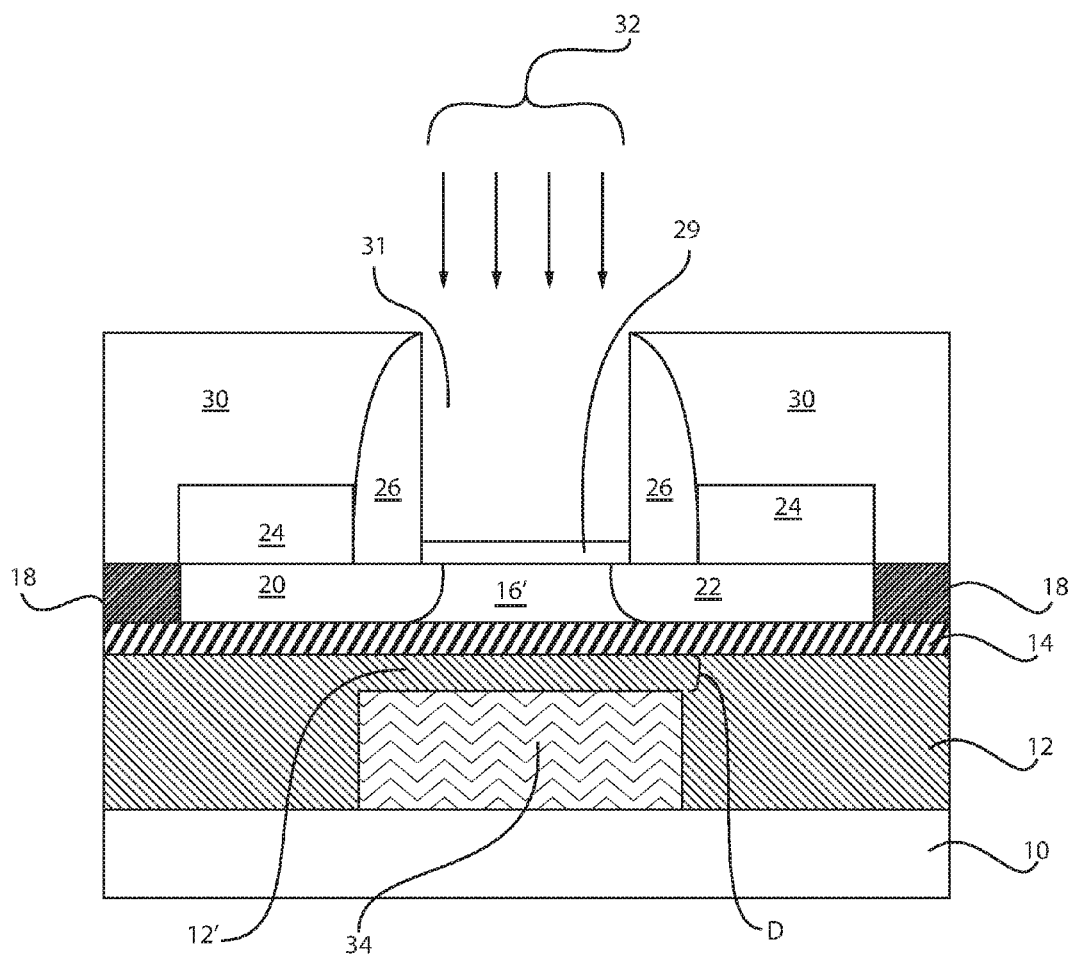
FIG. 4 is a cross-sectional view of the semiconductor device of FIG. 3 where an implanted silicon nitride (SiN) layer is formed within the SiN layer of the bilayer buried insulator by ion implantation, in accordance with an embodiment of the present invention.

FIG. 4 is a cross-sectional view of the semiconductor device of FIG. 3 where an implanted silicon nitride (SiN) layer is formed within the SiN layer of the bilayer buried insulator by ion implantation, in accordance with an embodiment of the present invention.

In various embodiments, ion implantation 32 is performed through the recess 31, through the ETSOI channel 16', and through the thin $SiO_2$ layer 14 and into the SiN layer 12. The ion implantation 32 results in the formation of an implanted SiN region 34. The SiN region 34 is aligned with the ETSOI channel 16'. The SiN region 34 does not contact the $SiO_2$ layer 14. In fact, the top surface of the SiN region 34 is at a distance "D" from the bottom surface of the $SiO_2$ layer 14. The un-implanted SiN between the second layer 14 and the implanted SiN region 34 can be designated as 12'. The implantation species may include, but are not limited to, xenon, argon, germanium, silicon, arsenic, etc. The purpose of the implantation is to enhance the etch rate of the implanted SiN so that the implanted SiN can be removed selective to un-implanted SiN. The implantation dose and energy depend on the implantation species. In one embodiment, the implanted species is xenon with a dose of 3E14/ $cm^2$ to $2E15/cm^2$, an energy ranging from 20 keV to 150 keV.

Figure 5:
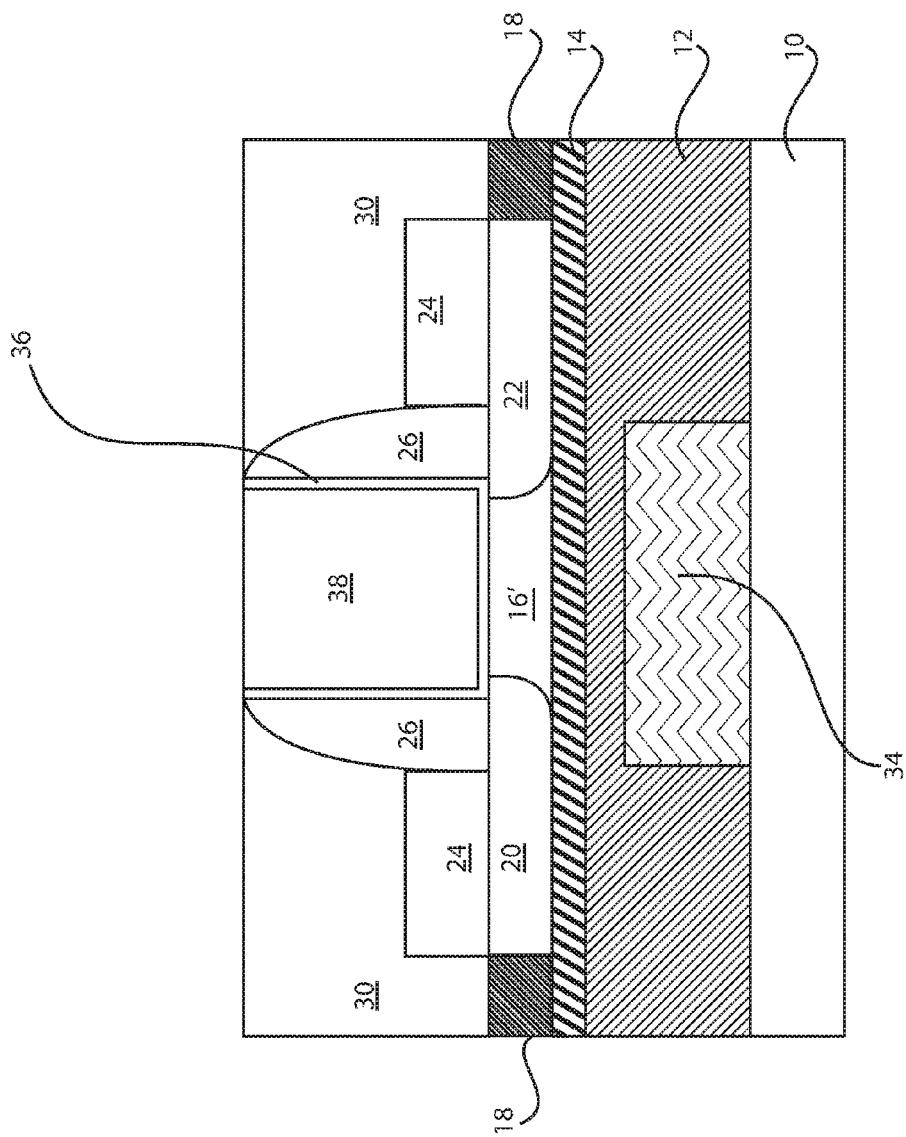
FIG. 5 is a cross-sectional view of the semiconductor device of FIG. 4 where a gate is formed within the recess formed by the removal of the dummy gate oxide, in accordance with an embodiment of the present invention.

FIG. 5 is a cross-sectional view of the semiconductor device of FIG. 4 where a gate is formed within the recess formed by the removal of the dummy gate oxide, in accordance with an embodiment of the present invention.

In various embodiments, the newly formed gate includes a gate dielectric 36 and gate conductor 38 that are deposited within the recess 31 (FIG. 4). The high-k material 36 contacts the inner surface of the sidewall spacers 26. The metal gate 38 is subsequently filled within the high-k material 36. The metal gate 38 is formed by deposition followed by planarization (e.g., CMP) so that it is flush with the top surface of the ILD 30.

The gate structure can include at least a gate conductor atop a gate dielectric. Gate conductor can be metal gate 38. The metal gate 38 can be any conductive metal including, but not limited to W, Ni, Ti, Mo, Ta, Cu, Pt, Ag, Au, Ru, Ir, Rh, and Re, and alloys that include at least one of the aforementioned conductive elemental metals. The metal gate 38 of the gate structure is typically present on a gate dielectric 36. The gate dielectric 36 can be a dielectric material, such as $SiO_2$, or alternatively high-k dielectrics, such as oxides of Ta, Zr, Al or combinations thereof. In another embodiment, the gate dielectric 36 can be comprised of an oxide, such as $SiO_2$, $ZrO_2$, $Ta_2O_5$ or $Al_2O_3$. In one embodiment, the gate dielectric 36 has a thickness ranging from 1 nm to 10 nm. In another embodiment, the gate dielectric 36 has a thickness ranging from 1.5 nm to 2.5 nm. In a preferred embodiment, the gate dielectric 36 is a high-k material.

The gate dielectric can be silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The gate conductor can be doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

The gate can further comprise a gate workfunction setting layer (not shown) between the gate dielectric and the gate conductor. The gate workfunction setting layer can be a metallic compound, including but not limited to: but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

The gate structure functions to switch the semiconductor device from an "on" to "off" state, and vice versa. The gate structure 38 is formed in alignment with the ETSOI channel 16'. The gate structure 38 typically includes at least a gate dielectric 36 that is also aligned with the ETSOI channel 16'. The gate dielectric 36 can preferably be a high-k material.

In various embodiments, the high-k material 36 can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb $(Sc_xTa_{1-x})O_3$), and lead zinc niobate (e.g., $PbZn_{1/3}Nb_{2/3}O_3$). The high-k material 36 can further include dopants such as lanthanum and/or aluminum. The stoichiometry of the high-K compounds can vary.

In various embodiments, the high-k material 36 can have a thickness in the range of about 1.5 nm to about 2.5 nm.

Figure 6:
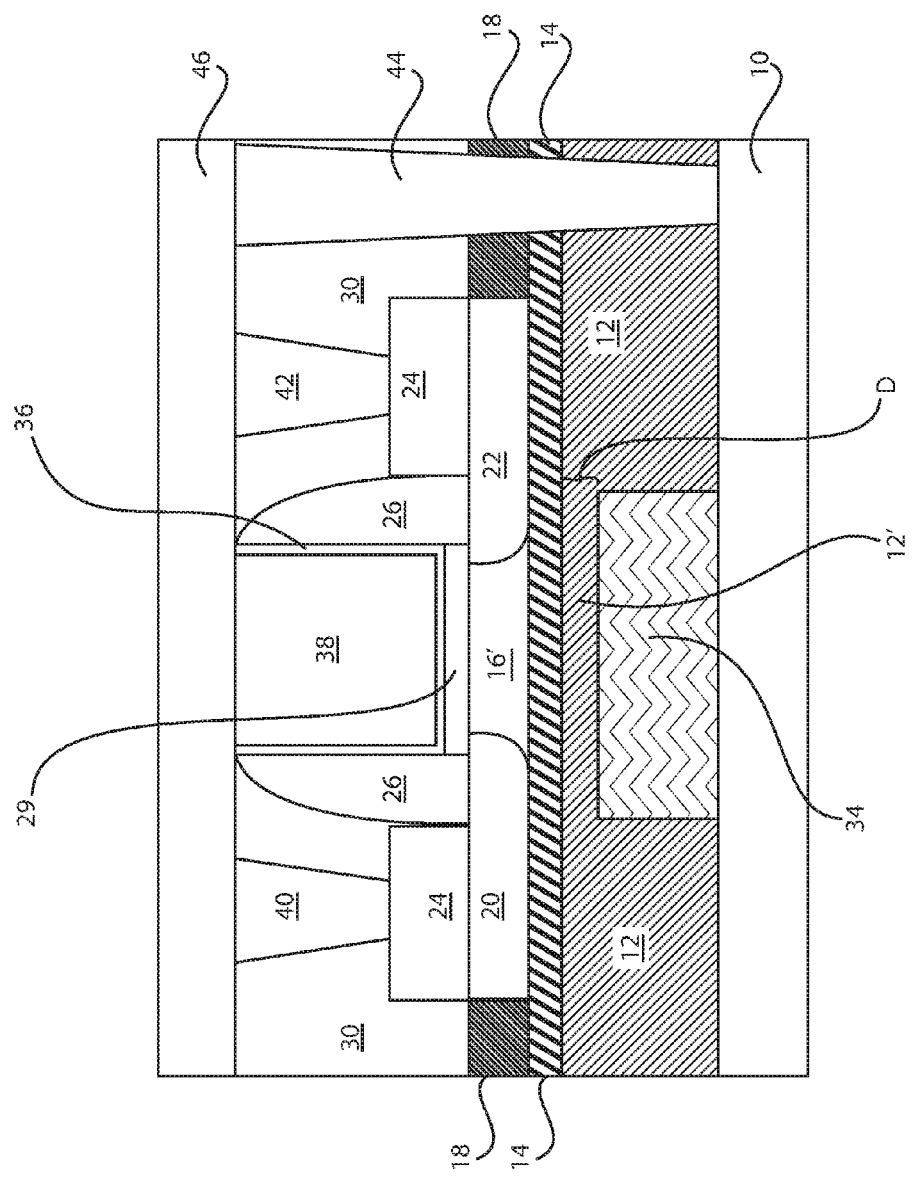
FIG. 6 is a cross-sectional view of the semiconductor device of FIG. 5 where contacts are formed over the raised source/drain and a BEOL is applied, in accordance with an embodiment of the present invention.

FIG. 6 is a cross-sectional view of the semiconductor device of FIG. 5 where contacts are formed over the raised source/drain and a BEOL is applied, in accordance with an embodiment of the present invention.

Contacts 40, 42, and 44 are formed within the ILD 30. The first contact 40 is formed over the raised source/drain region 24 of the source 20. The second contact 42 is formed over the raised source/drain region 24 of the drain 22. The third contact 44 is formed such that it extends through the ILD 30, through the second layer 14 ($SiO_2$), and through the unimplanted SiN 12 up to the top surface of the substrate 10. The third contact 44 can contact the substrate 10. The first and second contacts 40, 42 engage the top surface of the raised source/drain regions 24. The third contact 44 does not intersect or engage the implanted SiN 34.

Moreover, a BEOL layer 46 (or metallization layer) is deposited over the top surface of the contacts 40, 42, 44, over the top surface of the ILD 30, and over the top surface of the metal gate 38. The thickness of the BEOL layer 46 can be greater than the thickness of the second layer 14, the source 20, and the drain 22.

Concerning BEOL, a layer of dielectric material is blanket deposited atop the entire substrate and planarized. The blanket dielectric can be selected from the group consisting of silicon-containing materials such as $SiO_2$, $Si_3N_4$, SiOxNy, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

The blanket dielectric can be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to forth via holes to the various source/drain and gate conductor regions of the substrate. Following via formation interconnects are formed by depositing a conductive metal into the via holes using conventional processing, such as CVD or plating. The conductive metal can include, but is not limited to: tungsten, copper, aluminum, silver, gold, and alloys thereof. The BEOL layer can comprise one or multiple stacks of wires/vias.

Figure 7:
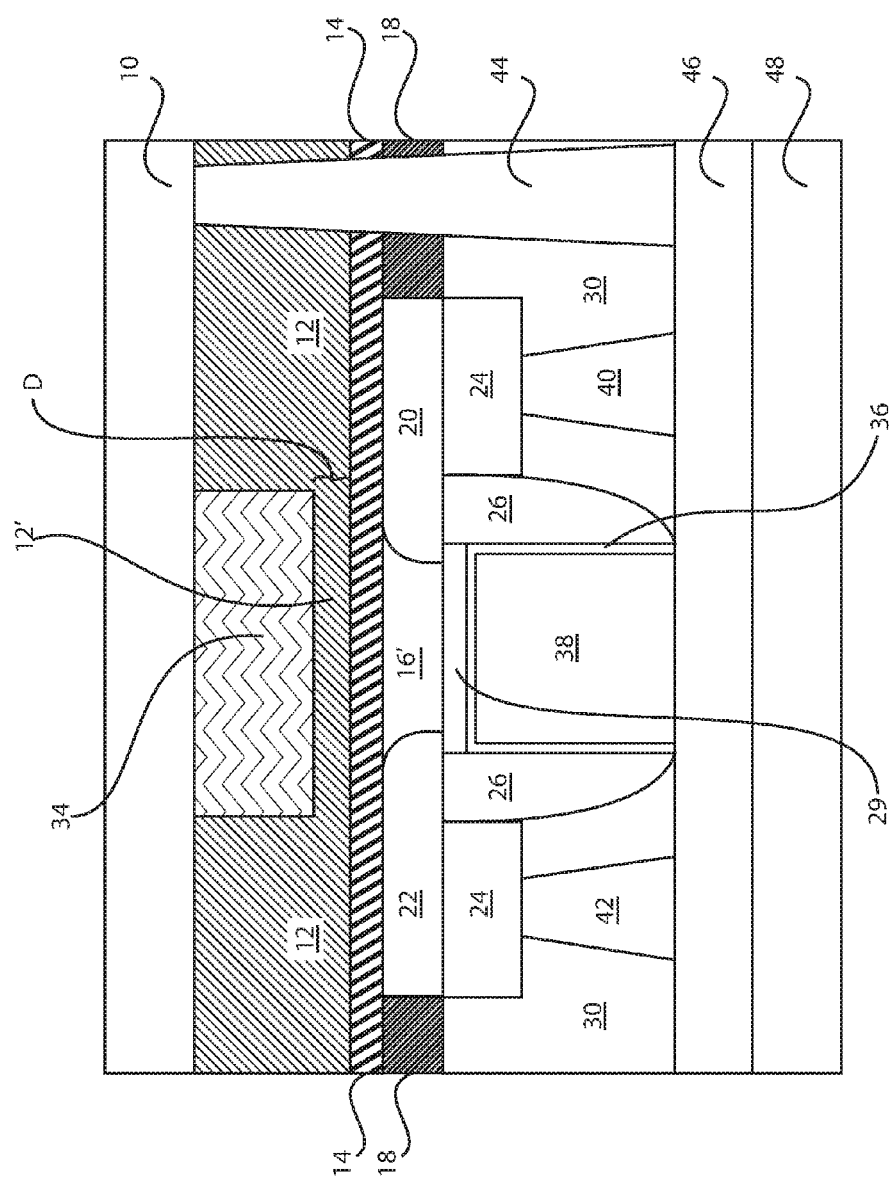
FIG. 7 is a cross-sectional view of the semiconductor device of FIG. 6 where a wafer is bonded to the carrier, in accordance with an embodiment of the present invention.

FIG. 7 is a cross-sectional view of the semiconductor device of FIG. 6 where a wafer is bonded to the carrier 48, in accordance with an embodiment of the present invention.

A 3D integrated circuit (3D IC) is an integrated circuit manufactured by stacking silicon wafers and/or dies and interconnecting them vertically using through silicon vias (TSVs) so that they behave as a single device to achieve performance improvements at reduced power and smaller footprint than conventional two dimensional processes. 3D IC is just one of a host of 3D integration schemes that exploit the z-direction to achieve electrical performance benefits. 3D semiconductor and packaging technology using through-silicon-vias (TSVs) are used to stack thinned semiconductor chips and to integrate heterogeneous semiconductor technologies into micro-electronic modules.

Figure 8:
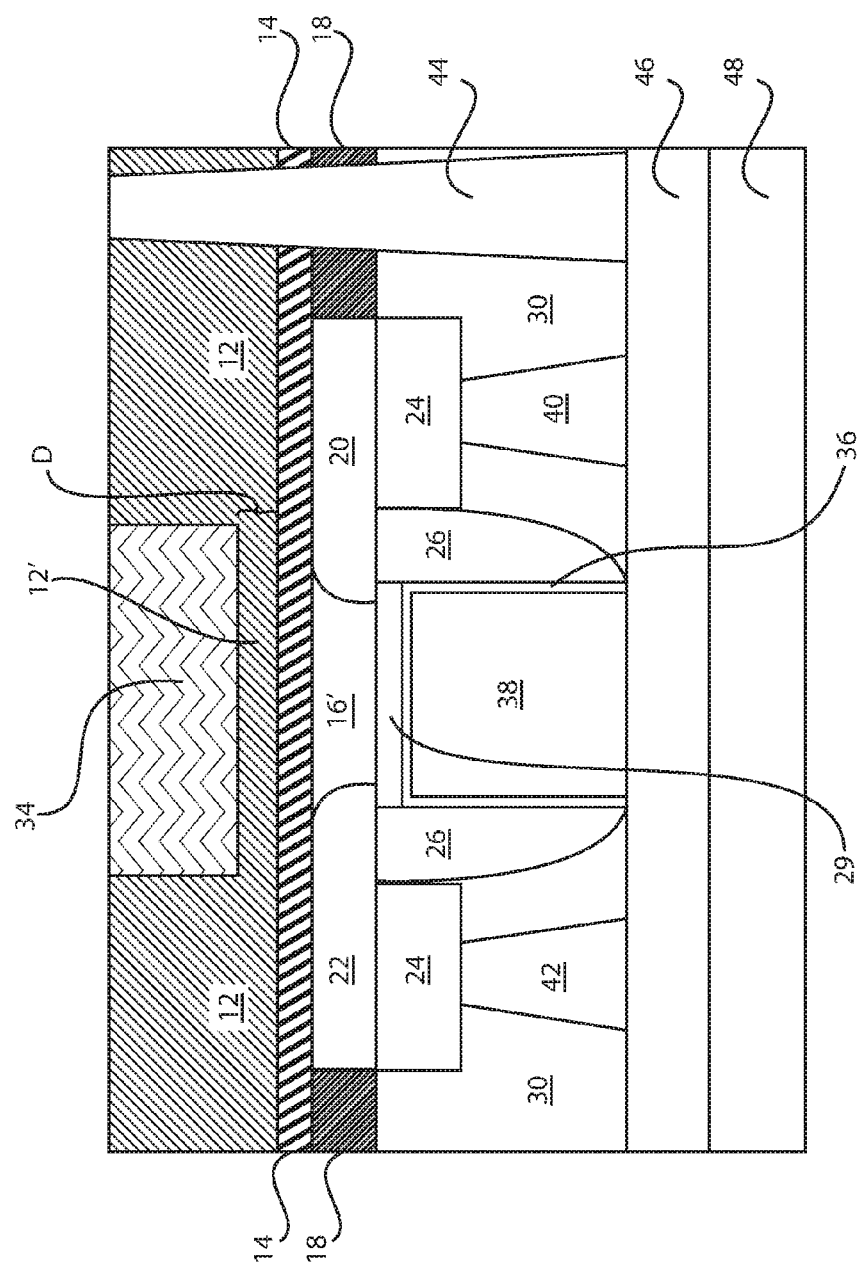
FIG. 8 is a cross-sectional view of the semiconductor device of FIG. 7 where the semiconductor substrate is removed, in accordance with an embodiment of the present invention.

FIG. 8 is a cross-sectional view of the semiconductor device of FIG. 7 where the semiconductor substrate 10 (FIG. 7) is removed, in accordance with an embodiment of the present invention.

In various embodiments, the removal of the substrate 10 results in the exposure of the un-implanted SiN 12 and the implanted SiN region 34, which is aligned with the ETSOI channel 16' and the metal gate 38. Additionally, the distal end of the third contact 44 is exposed. The removal of the substrate 10 can be done by performing grinding, chemical etching, polishing, or any suitable combination of those techniques.

Figure 9:
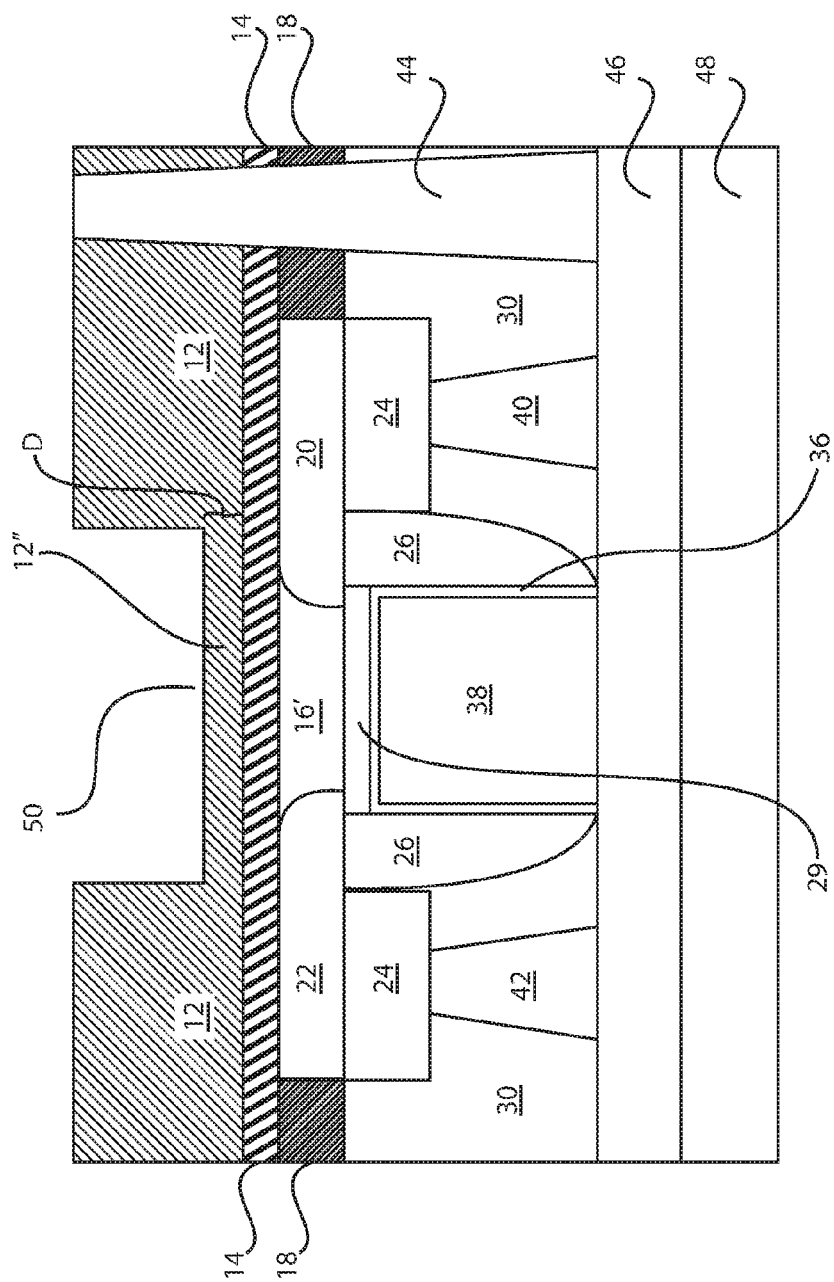
FIG. 9 is a cross-sectional view of the semiconductor device of FIG. 8 where the implanted SiN is removed to define a recess, in accordance with an embodiment of the present invention.

FIG. 9 is a cross-sectional view of the semiconductor device of FIG. 8 where the implanted SiN is removed to define a recess, in accordance with an embodiment of the present invention.

In various embodiments, the implanted SiN region 34 is etched. In one example, the etch selectivity of 10:1 can be achieved between implanted SiN and un-implanted SiN. The removal of the SiN region 34 results in a gap or recess 50 formed within the un-implanted SiN 12. In the case that the SiN is implanted with xenon, a wet etch comprising hydrofluoric acid can be used to etch implanted SiN selective to un-implanted SiN. In other words, the implanted SiN can be etch faster than the un-implanted SiN.

Figure 10:
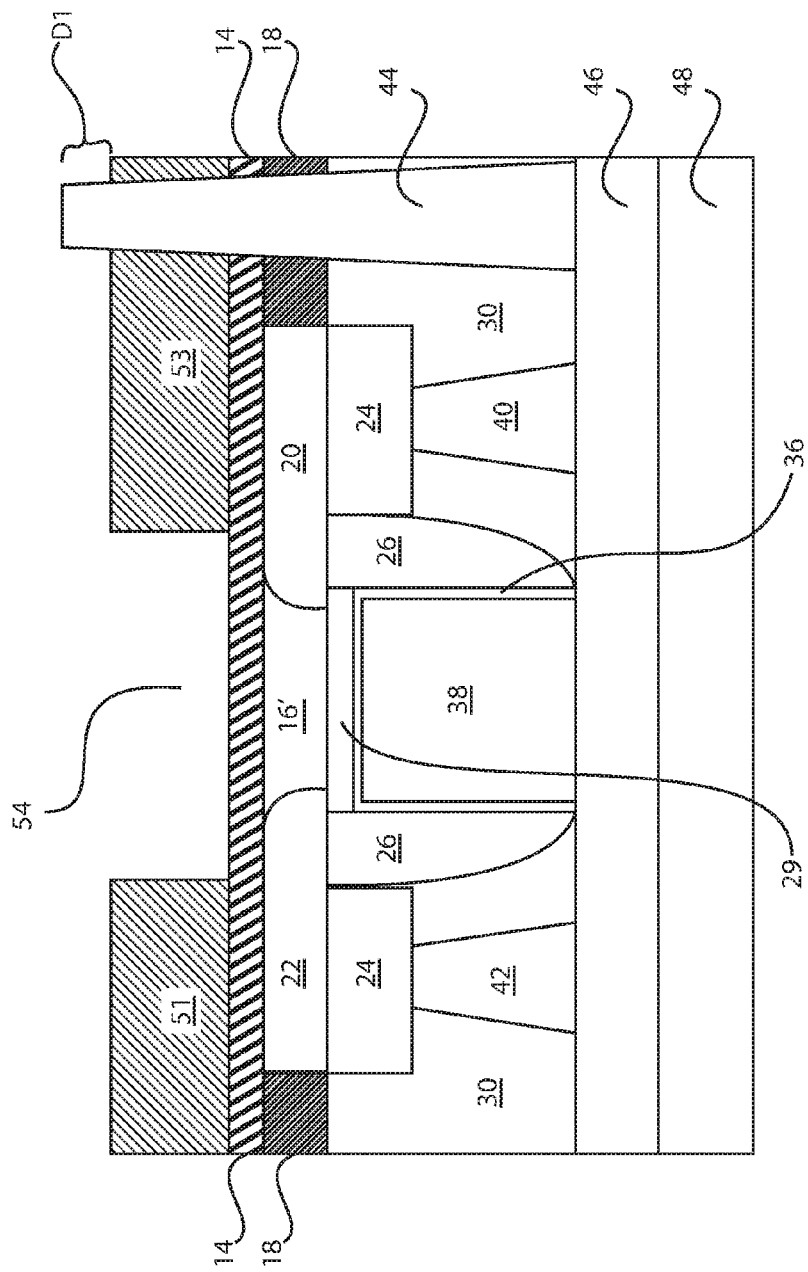
FIG. 10 is a cross-sectional view of the semiconductor device of FIG. 9 where the initial SiN is removed to expose a surface of the SiO₂ layer of the bilayer buried insulator, in accordance with an embodiment of the present invention.

FIG. 10 is a cross-sectional view of the semiconductor device of FIG. 9 where the initial SiN is removed to expose a surface of the $SiO_2$ layer of the bilayer buried insulator, in accordance with an embodiment of the present invention.

In various embodiments, a portion of the un-implanted SiN 12 is also selectively etched such that the portion 12' (FIG. 9) is completely removed to expose a surface (back side) of the second layer 14 (i.e., $SiO_2$) via recess 54. The exposed surface is aligned with the ETSOI channel 16'. The remaining SiN regions 51, 53 are shown as a result of the selective RIE etch. Additionally, the distal end of the contact 44 extends, by a distance "D1," beyond the SiN region 53. The remaining SiN regions 51, 53 have a thickness greater than the thickness of the second layer 14 (i.e., $SiO_2$). A significant thickness difference between the SiN regions 51, 53 and the second layer 14 (i.e., $SiO_2$) results in the reduction of the back gate to S/D overlap.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

Figure 11:
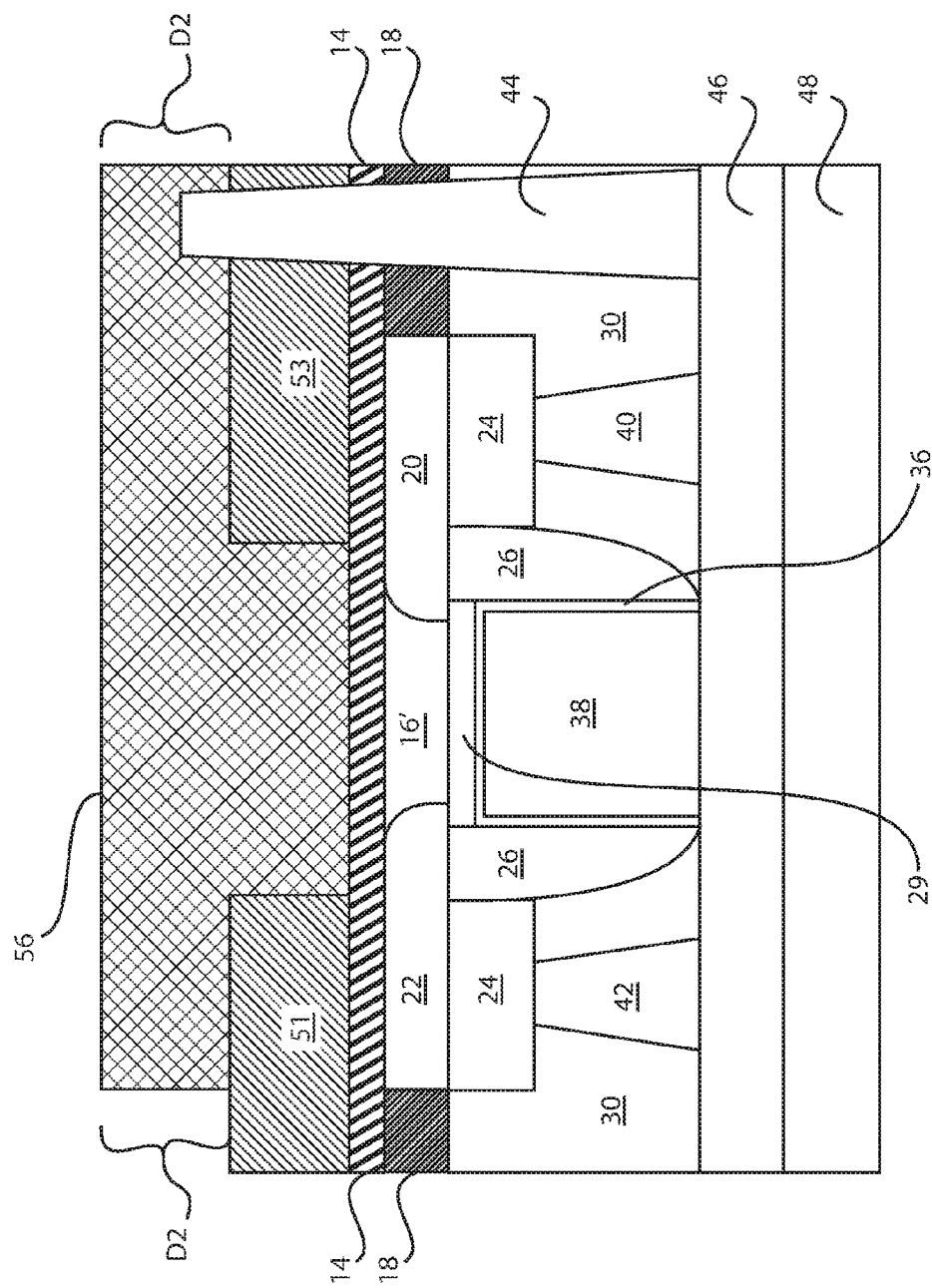
FIG. 11 is a cross-sectional view of the semiconductor device of FIG. 10 where the back gate is formed within the recess engaging the surface of the SiO₂ layer, in accordance with an embodiment of the present invention.

FIG. 11 is a cross-sectional view of the semiconductor device of FIG. 10 where the back gate is formed within the recess engaging the surface of the $SiO_2$ layer, in accordance with an embodiment of the present invention.

In various embodiments, the back gate 56 is formed over the SiN regions 51, 53, such that the back gate 56 covers or overlaps a portion of the SiN region 51 and covers or overlaps the entire SiN region 53. The back gate 56 also covers the distal tip of the third contact 44. The thickness of the back gate 56 over the SiN regions 51, 53 is designated as "D2." The back gate 56 contacts or engages an entire exposed surface of the second layer 14. The back gate 56 can be formed by metal deposition, CMP, and back gate patterning techniques. A back gate coupling can be created between the back gate 56 and the ETSOI channel 16' via the second layer (i.e., $SiO_2$). Additionally, the SiN region 53 allows for a reduced parasitic capacitance between the SiN region 53 and the drain 22.

Figure 12:
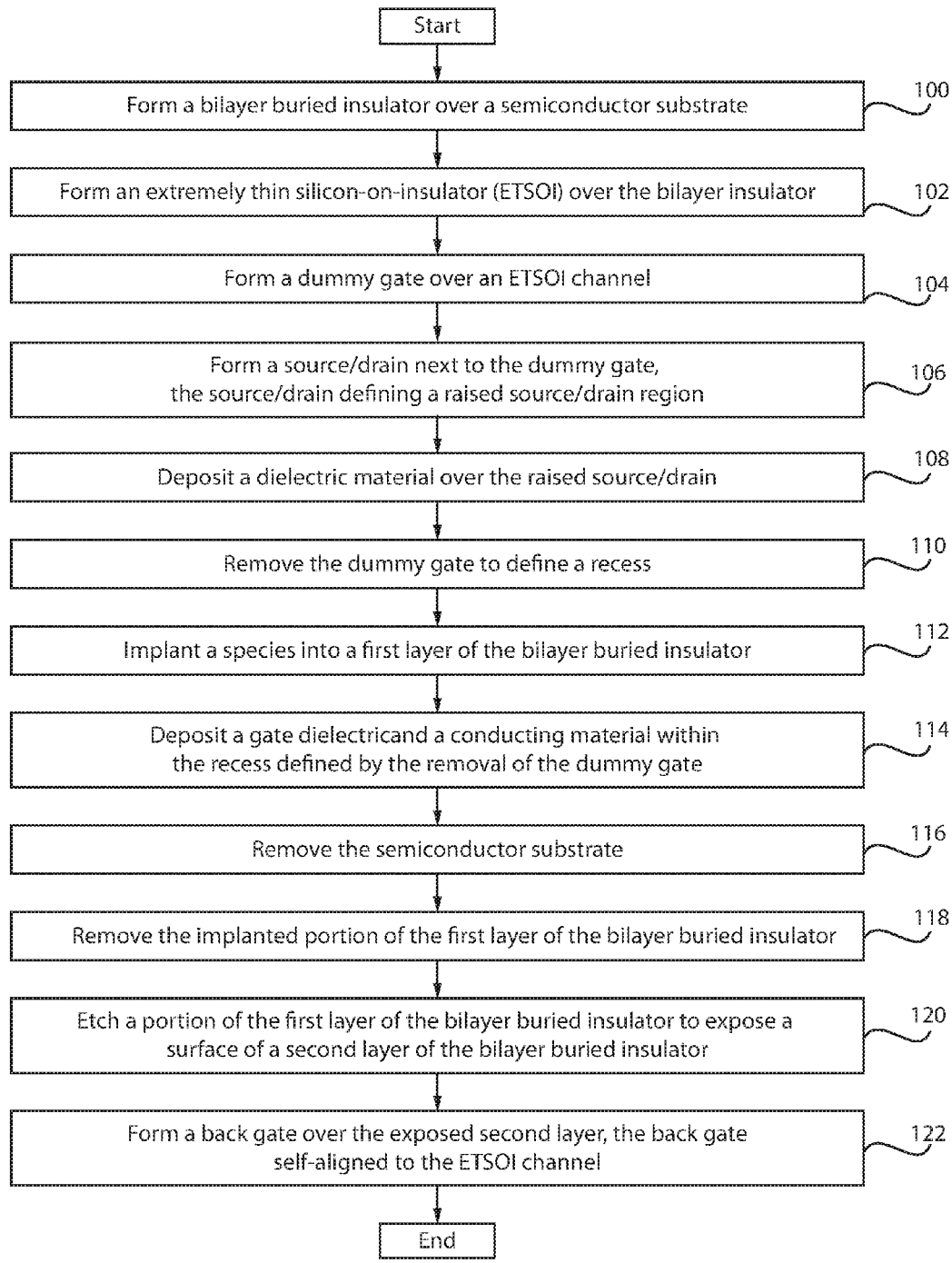
FIG. 12 is a block/flow diagram of an exemplary method for forming a semiconductor device for reducing parasitic back gate capacitance, in accordance with an embodiment of the present invention.

FIG. 12 is a block/flow diagram of an exemplary method for forming a semiconductor device for reducing parasitic back gate capacitance, in accordance with an embodiment of the present invention.

At block 100, a bilayer buried insulator is formed over a semiconductor substrate.

At block 102, an extremely thin silicon-on-insulator (ETSOI) is formed over the bilayer buried insulator.

At block 104, a dummy gate is formed over an ETSOI channel.

At block 106, source/drain are formed next to the dummy gate, the source/drain defining a raised source/drain region.

At block 108, a dielectric material is deposited over the raised source/drain.

At block 110, the dummy gate is removed to define a recess.

At block 112, a species is implanted within a first layer of the bilayer buried insulator.

At block 114, a gate dielectric and a conducting material are deposited within the recess defined by the removal of the dummy gate.

At block 116, the semiconductor substrate is removed.

At block 118, the implanted portion of the first layer of the bilayer buried insulator is removed.

At block 120, a portion of the first layer (SiN) of the bilayer buried insulator is etched to expose a surface of a second layer ($SiO_2$) of the bilayer buried insulator.

At block 122, a back gate is formed over the exposed second layer, the back gate self-aligned to the ETSOI channel formed between the source/drain.

Therefore, it is desired that the ETSOI device is fabricated with a thin buried oxide (BOX) and a back gate is formed underneath the BOX. The back gate can be formed, for example, by creating SiN regions adjacent the $SiO_2$ layer and creating an ETSOI channel aligned with the metal gate. The back gate is formed after forming the FDSOI transistor. The back gate is a metal conductor. Moreover, fabrication commences with a bilayer buried dielectric FDSOI substrate and then using implantation to damage the second dielectric layer (i.e., SiO$_2$) underneath the ETSOI channel region.

In an ETSOI transistor with a back gate and thin BOX, the electrical characteristics of the MOSFET can be controlled by applying a voltage to the back gate. By doing so, the threshold voltage of the ETSOI transistor is changed and as a result, the transistor current in the off- and on-states is modulated. Such modulation of the electrical characteristics of the MOSFET by a voltage applied to the back gate finds many applications, including power management, reduction in the chip-to-chip device variation, and fine tuning of the chips after manufacturing. Multiple Vt devices can also be achieved by applying different back bias at the back gate.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes Si$_x$Ge$_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for reducing parasitic back gate capacitance (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor structure with reduced parasitic back gate capacitance, the method comprising:
    forming a bilayer buried insulator over a semiconductor substrate;
    forming an extremely thin silicon-on-insulator (ETSOI) over the bilayer buried insulator;
    forming a dummy gate over an ETSOI channel;
    forming a source/drain next to the dummy gate, the source/drain defining a raised source/drain region;
    depositing a dielectric material over the raised source/drain;
    removing the dummy gate to define a recess;
    implanting a species within a first layer of the bilayer buried insulator;
    depositing a gate dielectric and a conducting material within the recess defined by the removal of the dummy gate;
    removing the semiconductor substrate;
    etching the implanted portion of the first layer of the bilayer buried insulator to expose a surface of a second layer of the bilayer buried insulator; and
    forming a back gate over the exposed second layer, the back gate self-aligned to the ETSOI channel.

2. The method of claim 1, wherein the back gate is formed after the ETSOI channel and the source/drain are formed.

3. The method of claim 1, wherein the first layer of the bilayer buried insulator is silicon nitride (SiN) and the second layer is silicon oxide ($SiO_2$).

4. The method of claim 3, wherein the SiN layer is about 100 nm and the $SiO_2$ layer is about 10 nm.

5. The method of claim 1, wherein the implanted species is silicon nitride (SiN).

6. The method of claim 1, wherein the species is implanted by ion implantation through the ETSOI channel and through the second layer of the bilayer buried insulator.

7. The method of claim 1, wherein the dielectric material is an inter-level dielectric (ILD).

8. The method of claim 7, further comprising forming contacts over the raised source/drain.

9. The method of claim 8, further comprising forming a back-end-of-line (BEOL) structure over the conducting material, the contacts, and the ILD.

10. The method of claim 9, wherein at least one contact extends from the back gate to the BEOL structure.

11. A semiconductor structure for reducing parasitic back gate capacitance, the structure comprising:
    a bilayer buried insulator formed over a semiconductor substrate;
    an extremely thin silicon-on-insulator (ETSOI) formed over the bilayer buried insulator;
    a source/drain formed adjacent an ETSOI channel, the source/drain defining a raised source/drain region;
    a dielectric material deposited over the raised source/drain;
    a dopant species implanted within a first layer of the bilayer buried insulator;
    a gate dielectric and a conducting material deposited over the ETSOI channel; and
    a back gate formed over a second layer of the bilayer buried insulator, the back gate self-aligned to the ETSOI channel.

12. The structure of claim 11, wherein the implanted species is aligned with the ETSOI channel.

13. The structure of claim 11, wherein the first layer of the bilayer buried insulator is silicon nitride (SiN) and the second layer is silicon oxide ($SiO_2$).

14. The structure of claim 13, wherein the SiN layer is about 100 nm and the $SiO_2$ layer is about 10 nm.

15. The structure of claim 11, wherein the implanted species is silicon nitride (SiN).

16. The structure of claim 11, wherein the species is implanted by ion implantation through the ETSOI channel and through the second layer of the bilayer buried insulator.

17. The structure of claim 11, wherein the dielectric material is an inter-level dielectric (ILD).

18. The structure of claim 17, wherein contacts are formed over the raised source/drain.

19. The structure of claim 18, wherein a back-end-of-line (BEOL) structure is formed over the conducting material, the contacts, and the ILD.

20. The structure of claim 19, wherein at least one contact extends from the back gate to the BEOL structure.

* * * * *